United States Patent [19]

Masuda

[11] Patent Number: 4,893,031
[45] Date of Patent: Jan. 9, 1990

[54] LOGICAL CIRCUITS FOR PERFORMING LOGICAL FUNCTIONS WITHOUT A POWER SUPPLY

[75] Inventor: Eiji Masuda, Kawasaki, Japan

[73] Assignee: Kabushiki Kaisha Toshiba, Kawasaki, Japan

[21] Appl. No.: 269,320

[22] Filed: Nov. 10, 1988

[30] Foreign Application Priority Data

Dec. 23, 1987 [JP] Japan ................. 62-323792

[51] Int. Cl.⁴ .................. H03K 19/20; G06F 7/38
[52] U.S. Cl. ..................... 307/451; 307/443; 307/445; 307/448; 307/465; 307/469; 364/716
[58] Field of Search ............. 307/451, 443, 270, 445, 307/448, 465, 468, 469; 364/716

[56] References Cited

U.S. PATENT DOCUMENTS 4,567,385  1/1986  Falater et al. ............. 307/451
4,652,777  3/1987  Cline ..................... 307/451

OTHER PUBLICATIONS

Balasubramanian, "Increasing Chip Density by Space Sharing of Programmed Logic Arrays", IBM Technical Disclosure Bulletin, vol. 20, No. 10, Mar. 1978, pp. 4016–4018.
Hiltelbeitel, "Two-Device CMOS Logic Functions", IBM Technical Disclosure Bulletin, vol. 27, No. 6, Nov. 1984, p. 3346.

*Primary Examiner*—Stanley D. Miller
*Assistant Examiner*—Trong Quang Phan
*Attorney, Agent, or Firm*—Foley & Lardner, Schwartz, Jeffery, Schwaab, Mack, Blumenthal & Evans

[57] ABSTRACT

Two basic logical circuits having a transfer gate section consisting of a channel MOS transistor and a P-channel MOS transistor, the gate electrode of the former being connected to a first input terminal to which a first input signal is applied, the gate electrode of the latter being connected to a second input terminal, the source electrodes of the N-channel and P-channel MOS transistors connected in parallel being connected to a third input terminal to which a third input signal is applied, and either a P-channel MOS switching transistor or a N-channel MOS transistsor. When the P-channel MOS transistor is used as the switching transistor, its gate electrode is connected to the first input terminal and the remaining electrodes are connected to an output terminal and the second input terminal, thereby realizing either NAND operation or OR operation by the same circuit construction but in accordance with the combination of the three input signals. On the other hand, when the N-channel MOS transistor is used as the switching transistor, its gate electrode is connected to the second input terminal and the remaining electrodes thereof are connected to the output terminal and the first input terminal, thereby realizing either AND or NOR operation by the same circuit construction but in accordance with the different combination of the three input signals applied to the three imput terminals.

14 Claims, 9 Drawing Sheets

FIG. 1 (A)
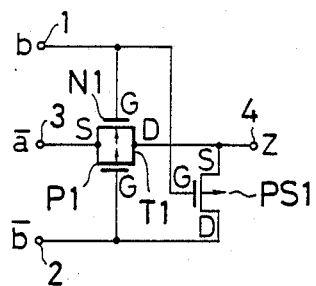
FIG. 1 (B)
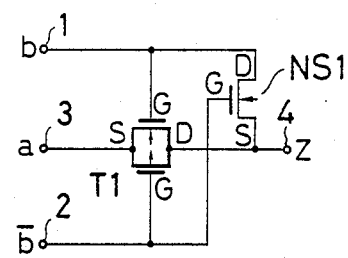
FIG. 1 (C)
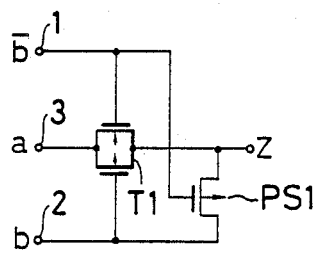
FIG. 1 (D)
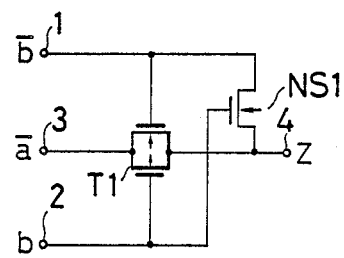
FIG. 2 (A)
| INPUT SIGNAL | | | T GATE | P SWITCH | OUTPUT SIGNAL |
|---|---|---|---|---|---|
| $\bar{a}$ | b | $\bar{b}$ | | | Z |
| 0 | 1 | 0 | ON | OFF | 0 (= $\bar{a}$) |
| 0 | 0 | 1 | OFF | ON | 1 (= $\bar{b}$) |
| 1 | 1 | 0 | ON | OFF | 1 (= $\bar{a}$) |
| 1 | 0 | 1 | OFF | ON | 1 (= $\bar{b}$) |

FIG. 2 (B)

| INPUT SIGNALS | | | T GATE | N SWITCH | OUTPUT SIGNAL |
|---|---|---|---|---|---|
| a | b | $\bar{b}$ | | | Z |
| 1 | 1 | 0 | ON | OFF | 1 (=a) |
| 1 | 0 | 1 | OFF | ON | 0 (=b) |
| 0 | 1 | 0 | ON | OFF | 0 (=a) |
| 0 | 0 | 1 | OFF | ON | 0 (=b) |

FIG. 2 (C)

| INPUT SIGNALS | | | T GATE | P SWITCH | OUTPUT SIGNAL |
|---|---|---|---|---|---|
| a | b | $\bar{b}$ | | | Z |
| 1 | 1 | 0 | OFF | ON | 1 (=b) |
| 1 | 0 | 1 | ON | OFF | 1 (=a) |
| 0 | 1 | 0 | OFF | ON | 1 (=b) |
| 0 | 0 | 1 | ON | OFF | 0 (=a) |

FIG. 2 (D)

| INPUT SIGNALS | | | T GATE | N SWITCH | OUTPUT SIGNAL |
|---|---|---|---|---|---|
| $\bar{a}$ | b | $\bar{b}$ | | | Z |
| 0 | 1 | 0 | OFF | ON | 0 (=$\bar{b}$) |
| 0 | 0 | 1 | ON | OFF | 0 (=$\bar{a}$) |
| 1 | 1 | 0 | OFF | ON | 0 (=$\bar{b}$) |
| 1 | 0 | 1 | ON | OFF | 1 (=$\bar{a}$) |

OR GATE

AND GATE

LOGICAL CIRCUITS FOR PERFORMING LOGICAL FUNCTIONS WITHOUT A POWER SUPPLY

BACKGROUND OF THE INVENTION

1. Field of the Invention

The present invention relates to logical circuits for realizing low power consumption and suitable for very large integrated circuits.

2. Description of the Prior Art

In circuit designs such as for large scale integrated circuits (LSI circuits), various circuit combinations of basic logical circuits such as AND gate circuits, OR gate circuits, NOT circuits are utilized. For instance, when a logical system is to be constructed with CMOS transistors, then NAND gate circuits, NOR gate circuits, and NOT circuits are mainly used as basic logical circuits.

FIGS. 11 to 13 show, respectively, a NAND gate circuit, a NOR gate circuit, and a NOT circuit, each consisting of one or more P-channel MOS transistors (PMOS transistors) and one or more N-channel MOS transistors (NMOS).

Each of the logical circuits is arranged by one or more pairs of PMOS and NMOS transistors between a power supply $V_{DD}$ and the ground level, and each of the PMOS and NMOS transistors is controlled by an input signal to be applied to each of the input terminals of IN1 and IN2, so as to charge or discharge the output terminal, thereby realizing each desired logical function.

Namely, in these logical circuits, a predetermined logical level is given to an output terminal, corresponding to an input signal or signals by rendering the path between the power supply and the ground, or between the output terminal and the ground, conductive or non-conductive. Moreover, such unitary logical circuits as described are operated when a power supply is applied to each of the circuits. Accordingly, when a logical system is constructed with combinations of each of these unitary logical circuits, the power consumption in the system is expressed by the sum of inner penetrating current and the charging or discharging current when the output signal is changed in each of the unitary logical circuits. As a result, with the development of the large scale integrated circuits for logical systems due to an increase in the unitary logical circuits to be used, power consumption increases. For example, the power consumption of a LSI including 1,000,000 MOS transistors normally amounts 1 W to 5 W. The shortening in the switching time due to a further increase in the operation speed causes the change in the power supply current per unit hour to increase. This will result in the generation of noise current, thereby causing malfunction to occur.

On the other hand, the increase in the power consumption causes an excessive current to flow in the power supply wirings which are made very narrow due to the recent use of highly concentrated integrated circuits. As a result, the so called "electro-migration" phenomena tends to occur. This causes degradation in IC quality, which in turn results in the decrease in the reliability of the IC circuits.

Moreover, the development of LSI logical systems has made their corresponding construction become more complex and so it is often difficult to tap in to the local power supply currents in a system design stage. This in turn has made the layout of the power supply wiring system very difficult.

SUMMARY OF THE INVENTION

It is therefore an object of the present invention to eliminate the above mentioned problem and provide a logical circuit suitable for LSI circuits that is low in power consumption.

One feature of the present invention resides in a logical circuit for performing logical functions without the use of a power supply. The logical circuit comprises a transfer gate section having a first type MOS transistor, the gate electrode of which is connected to a first input terminal to which a first signal having one polarity is applied, and a second type MOS transistor, the gate electrode of which is connected to a second input terminal to which a second signal having the opposite polarity is applied. The source electrodes of the first and second MOS transistors are connected parallel with each other and are further connected to a third input terminal to which a third input signal is applied. The drain electrodes, also being connected parallel with each other, are connected to an output terminal. The transfer gate section also includes a second type MOS switching transistor, and its gate electrode is connected to the first input terminal with the remaining electrodes being connected to the output terminal and the second terminal. With this arrangement either logical NAND or OR operation of the two input signals applied to the second and third terminals can be performed.

Another feature of the present invention resides in a logical circuit for performing logical functions without a power supply. This logical circuit comprises a transfer gate section having a first type MOS transistor, the gate electrode of which is connected to a first input terminal to which a first signal having one polarity is applied, and a second type MOS transistor, the gate electrode of which is connected to a second input terminal to which a second signal having the opposite polarity is applied. The source electrodes of the first and second MOS transistors are connected parallel with each other and are further connected to a third input terminal to which a third input signals is applied. The drain electrodes which are connected parallel with each other are also connected to an output terminal. The transfer gate further includes a first type MOS switching transistor, and its gate electrode is connected to the second input terminal. With the remaining electrodes being connected to the output terminal and the first input terminal. In this arrangement either logical AND or NOR operation of the two input signals applied to the first and third terminals can be performed.

BRIEF DESCRIPTION OF THE DRAWINGS

FIGS. 1(A) and 1(C) show a basic logical circuit according to the present invention for realizing either NAND or OR logical operation;

FIGS. 1(B) and 1(D) show a second basic logical circuit according to the present invention for realizing either AND or NOR logical operation;

FIG. 2(A) shows the truth table of the logical operation of the circuit of FIG. 1(A);

FIG. 2(B) shows the truth table of the logical operation of the circuit of FIG. 1(B);

FIG. 2(C) shows the truth table of the circuit of FIG. 1(C);

FIG. 2(D) shows the truth table of the circuit of FIG. 1(D);

DETAILED DESCRIPTION OF THE PREFERRED EMBODIMENTS

Figure 3:
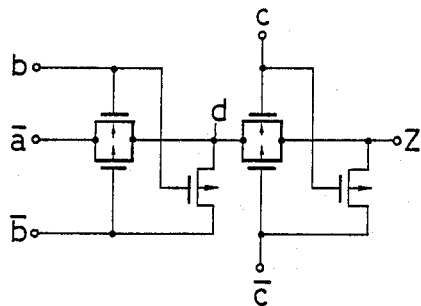
FIGS. 3(A) and 3(B) show a third embodiment of the NAND gate circuit for three input signals $\bar{a}$, $\bar{b}$, and $\bar{c}$ and its equivalent circuit, according to the present invention.
Figure 3:
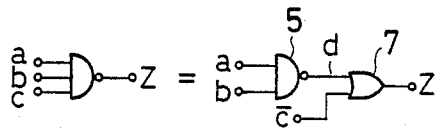

FIG. 1(A) indicates a NAND gate circuit according to the present invention which comprises a transfer gate circuit T1 consisting of a PMOS transistor P1, a NMOS transistor N1, and a PMOS switching transistor PS1.

The transfer gate section T1 is constructed in a manner so that the gate electrode of the NMOS transistor N1 is connected to a first input terminal 1, and the gate electrode of the PMOS transistor P1 is connected to a second input terminal 2 while each source electrode of the transistors N1 and P1 is connected with each other to a third terminal 3, and each drain of the transistors N1 and P1 is connected with each other to an output terminal 4. The gate electrode of the switching PS1 is connected to the first terminal 1, the drain electrode thereof being connected to the second terminal 2 and the source electrode thereof also being connected to the output terminal 4.

It is noted from the above description that each gate electrode of the transistors P1 and N1 is applied with input signals b, $\bar{b}$, each having opposite polarities through the input terminals 1 and 2. When a high level input signal "1" is applied to the input terminal 1 while a low level input signal "0" is applied to the input terminal 2, the transfer gate T1 is rendered conductive, thus the input signal $\bar{a}$ applied to the input terminal 3 is transferred to the output terminal 4. In this case, the switching transistor PS1 has its gate electrode connected to the input terminal 1 while its source and drain electrodes thereof are respectively connected to the output terminal 4 and an input terminal 2. As a result, the switching transistor PS1 is rendered conductive when the input signal "0" is applied to the input terminal 1 and when the input signal $\bar{b}$ to be applied to the input terminal 2 is transferred to the output terminal 4.

FIG. 2(A) shows the logical operations of the circuit of FIG. 1(A). Namely, when the three input signals $\bar{a}$, b, $\bar{b}$ are "0", "1", "0" respectively, the transfer gate circuit T1 is rendered conductive and the switching transistor PS1 is rendered non-conductive, and the input signal $\bar{a}=0$ is transferred to the output terminal 4, i.e., the output signal $z=\bar{a}=0$.

Similarly, when the three input signals $\bar{a}$, b, $\bar{b}$ are "0", "0", "1", the transfer gate circuit T1 is rendered non-conductive and the switching transistor PS1 is rendered conductive, and the input signal $\bar{b}$ is transferred to the output terminal 4, i.e., the output signal $z=\bar{b}=1$.

On the other hand, when the input signals $\bar{a}=1$, $b=1$, $b=0$ are applied to the input terminals, the transfer gate circuit T1 is rendered conductive and the switching transistor PS1 is rendered non-conductive. As a result, the input signal $\bar{a}=1$ is transferred to the output terminal 4, thereby the output signal is $z=\bar{a}=1$. Likewise, when the input signals $\bar{a}=1$, $b=0$, and $\bar{b}=1$, are applied to the input terminals, the transfer gate circuit T1 is turned off and the switching transistor PS1 is turned on. As a result, the input signal $\bar{b}$ is transferred to the output terminal 4, i.e., the output signal z is $z=\bar{b}=1$. From the above operation, the output signal z can be expressed as follows:

$$z=\bar{a}+\bar{b}=\overline{a\cdot b}$$

Namely, NAND operation can be realized by the circuit shown in FIG. 1(A).

FIG. 1(B) indicates a logical AND circuit. The AND circuit comprises the same transfer gate section T1 as that of FIG. 1(A). The only difference is that a switching transistor NS1 of the NMOS transistor is used in this case and it has its gate electrode connected to the input terminal 2, its source electrode connected to the output terminal 4, and its drain electrode connected to the input terminal 1.

In this circuit, when the transfer gate T1 is turned on, the input signal $a=1$ applied to the transfer gate T1 is transferred to the output terminal 4 in the same manner as that of FIG. 1(A). However, when the input signal $\bar{b}=1$ applied to the input terminal 2, the input signal $b=0$ applied to the input terminal 1 is transferred to the output terminal 4. Therefore, the AND gate function $z=a\cdot b$ can be performed as shown in the truth table of FIG. 2(B).

FIG. 1(C) indicates an OR gate circuit according to the present invention. The circuit construction of this OR gate circuit is the same as that of FIG. 1(A) but the input signals to be applied to the input terminals 1, 2, and 3 are different from those FIG. 1(A).

Namely, the transfer gate section T1 is turned on when the input signals $\bar{b}=1$ and $b=0$ are applied to the terminals 1 and 2, and the input signal a applied to the input terminal 2 is transferred to the output terminal 4. On the other hand, however, when the input signal $\bar{b}=0$ is applied to the input terminal 1, the input signal b applied to the input terminal 2 is transferred to the output terminal 4. Accordingly, the OR gate function can be realized, as will be appreciated from the truth table of FIG. 2(C).

FIG. 1(D) shows a NOR gate circuit according to the present invention. In this circuit, when the input signals $\bar{b}=1$ and $b=0$ are applied to the input terminals 1 and 2, the transfer gate T1 is turned on and the input signal $\bar{a}$ applied to the input terminal 2 is transferred to the output terminal 4 as an output signal z.

On the other hand, however, when the input signals $\bar{b}=0$ and $b=1$ are applied to the input terminals 1 and 2, the input signal $\bar{b}$ applied to the input terminal 1 is transferred to the output terminal 4 as the output signal z. Accordingly, a NOR gate circuit can be realized from the logical circuit shown in FIG. 1(D) according to the truth table of FIG. 2(D). Namely, the NOR logic $z=\overline{a \cdot b}=\bar{a}+\bar{b}$ can be obtained.

As described in the foregoing embodiments, each of the logical operations to the input signals can be realized without using a power supply, thus strikingly reducing power consumption.

FIG. 3(A) shows a combined NAND gate circuit having three input terminals $\bar{a}, \bar{b}, \bar{c}$. The NAND gate circuit consists of a NAND gate 5 having input terminals for input signals a, b and an OR gate 7 receptive of the output signal d from the NAND gate 5 and an input signal $\bar{c}$ which is an inverted signal of an input signal c as shown in an equivalent circuit of FIG. 3(B). Namely, this circuit is constructed by two stages of the logical NAND gate circuits of FIG. 1(A) connected in a cascade.

In operation, the first stage logical circuit operates as a NAND gate for two input signals a, b and the second stage logical circuit operates as an OR gate for two input signals $\bar{c}$ and an output signal d from the first stage logical circuit.

Figure 4:
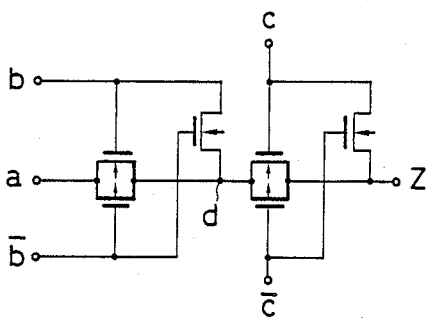
FIGS. 4(A) and 4(B) show a fourth embodiment of the AND gate circuit for three input signals a, b, and c and its equivalent circuit, according to the present invention.
Figure 4:
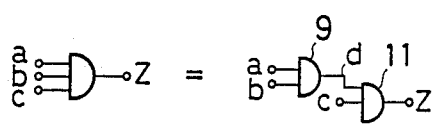

FIG. 4(A) shows an AND gate circuit for three input signals a, b, and c. This AND gate circuit is equivalent to the circuit shown in FIG. 4(B). Namely, it is comprised of a first AND gate 9 for input signals a and b, and a second AND gate 11 for an output signal d from the first AND gate 9 and for an input signal c, which are connected in a cascade.

The first AND gate 9 operates for input signals b and a, while the second AND gate 11 operates for input signals c, and an output signal d from the first gate circuit.

Figure 5:
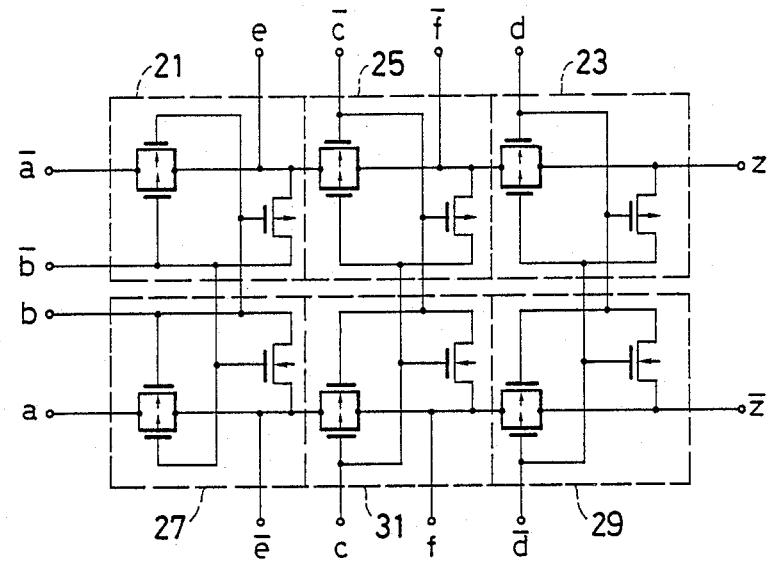
FIG. 5 shows another embodiment of a combined logical circuit comprising the various logical circuits shown in FIGS. 1(A) to 1(D), according to the present invention.
Figure 6:
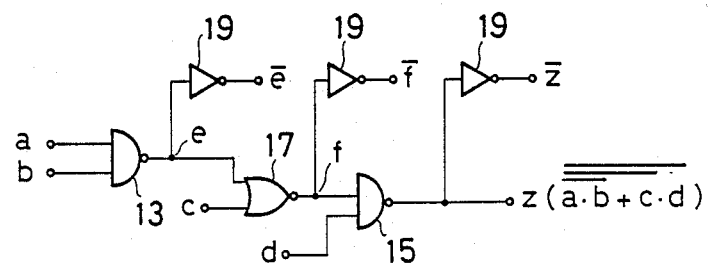
FIG. 6 shows an equivalent circuit of FIG. 5.

FIG. 5 shows a combined complex logical circuit according to the present invention and FIG. 6 shows its equivalent circuit construction. The complex logical circuit shown in FIG. 5 is comprised of NAND gate sections 21 and 23 and an OR gate section 25, AND gate sections 27 and 29, and a NOR gate section 31. The NAND gate section 21 is receptive of input signals a, b, $\bar{b}$ and produces an output signal e. The OR gate section 25 is receptive of input signals c, $\bar{c}$ and an output signal $\bar{e}$ from the NAND gate section 21, and produces an output signal $\bar{f}$. Similarly, the NAND gate section 23 is receptive of the input signal d, $\bar{d}$ and the output signal $\bar{f}$ from the OR gate section 25, and produces an output signal z.

On the other hand, the AND gate section 27 is receptive of input signals a, b, $\bar{b}$, and produces an output signal $\bar{e}$. The NOR gate section 31 is receptive of input signal c, $\bar{c}$ and the output signal $\bar{e}$ from the AND gate section 27, and produces an output signal f. The AND gate section 29 is receptive of the input signals d, $\bar{d}$ and the output signal f from the NOR gate section 31, and produces an output signal $\bar{z}$.

Each of the logical circuits connected in a cascade is constructed in the same manner, and different logical operations are performed by each of the same logical circuits for the same input signals, thus producing inner logical output signals (f, $\bar{f}$) including the inverted signals of $\bar{f}$. In FIG. 6, which is an equivalent circuit of FIG. 5, the combined complex logical circuit comprises NAND gates 13 and 15, an NOR gate 17, and inverters or NOT circuits 19, 19, 19 in order to produce an output signal $\bar{e}$ and $\bar{f}$ as well as the output signals z and $\bar{z}$ from input signals a, b, c, d.

Figure 7:
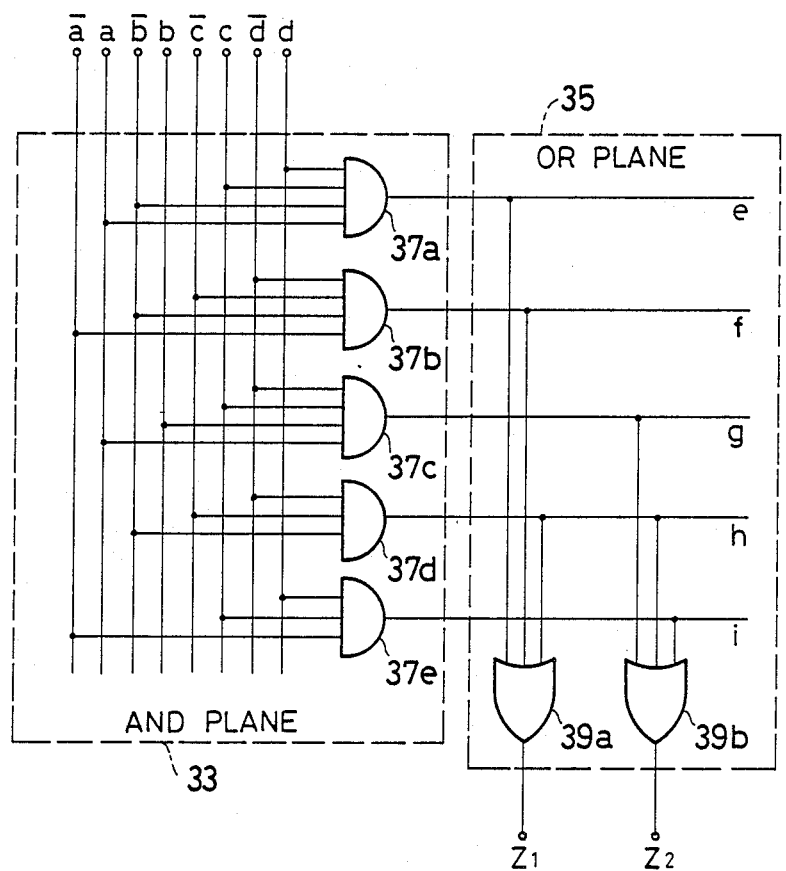
FIG. 7 shows another embodiment of the logical circuit as a PLA (programmable logic array) according to the present invention.

FIG. 7 shows a programmable logic array (PLA) constructed by the logical circuits. In the figure, the PLA is comprised of an AND plane 33 and an OR plane 35 and the following output signals $Z_1$ and $Z_2$ are produced from the OR plane 35 in accordance with input signals a, $\bar{a}$, b, $\bar{b}$, c, $\bar{c}$, and d, $\bar{d}$.

The AND plane 33 is comprised of an AND gate 37a having input terminals for input signals a, $\bar{b}$, c, d, an AND gate 37b having input terminals for input signals $\bar{a}, \bar{b}, \bar{c}, \bar{d}$, and AND gate 37c having input terminals for the input signals a, b, c, d. There is also an AND gate 37d having input terminals for the input signals $\bar{a}$, $\bar{b}$, $\bar{c}$, and an AND gate 37e having input terminals for the input signals $\bar{a}$, c, d.

On the other hand, the OR plane 35 is comprised of an OR gate 39a receptive of the output signals e, f, h which correspond to each of the AND gates 37a, 37b, 37d, so as to produce an output signal $Z_1$ and an OR gate 39b receptive of the output signals g, h, i corresponding to each of the AND gates 37c, 37d, 37e, so as to produce an output signal $Z_2$.

Namely, the following logical equations can be obtained by the PLA:

$$Z_1 = e + f + h = (a \cdot \bar{b} \cdot c \cdot d) + (\overline{a \cdot b \cdot c \cdot d}) + (\overline{b \cdot c \cdot d})$$

$$Z_2 = g + h + i = (a \cdot b \cdot c \cdot \bar{d}) + (\overline{b \cdot b \cdot d}) + (\bar{a} \cdot c \cdot d)$$

Figure 8:
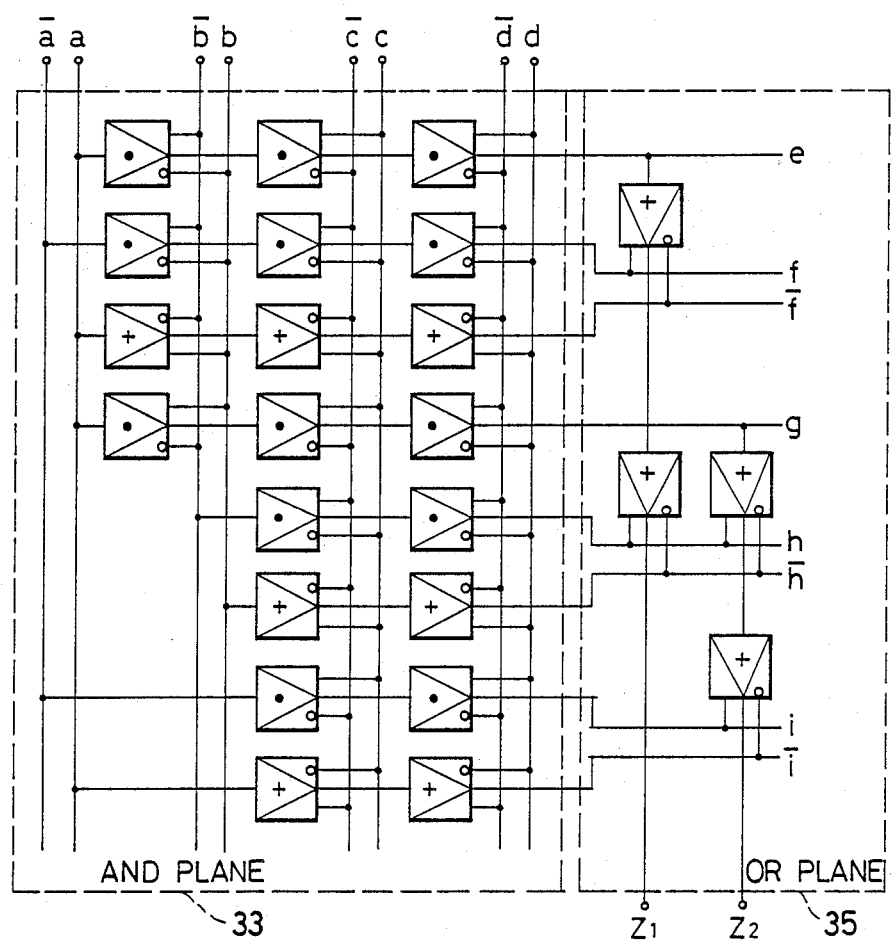
FIG. 8(A) shows one embodiment of the PLA constructed by the basic logical circuits according to the present invention.
FIG. 8(B) shows symbols of the logical circuits and their circuit constructions used in FIG. 8(A)
Figure 8:
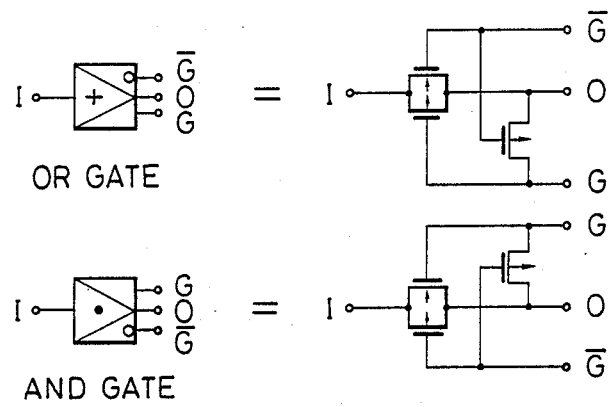

FIG. 8(A) shows one embodiment of the PLA combined by the logical circuits according to the present invention. The symbols used in FIG. 8(A) are indicated in FIG. 8(B) which are the OR gate circuit shown in FIG. 1(C) and the AND gate circuit shown in FIG. 1(B).

In the OR gate circuits in the OR plane 35 in FIG. 8(A), the inverted signals $\bar{f}, \bar{h}, \bar{i}$ of the output signals from the AND plane 33 are necessary. Accordingly, the inverted signals $\bar{f}, \bar{h}$, and $\bar{i}$ are produced from the OR gate section connected in a cascade together with the output signals f, h, i, in accordance with the relationship of $\bar{Z} = \bar{a} + \bar{b} + \bar{c}$ when $Z = a \cdot b \cdot c$. The PLA shown in FIG. 7 and the complex logical circuit shown in FIGS. 5 and 6 can be constructed by the logical circuits shown in FIGS. 1(C) and 1(B), thereby strikingly reducing the power consumption.

In the large integrated logical circuits (LSI) which are constructed by the combination of various logical circuits, sequential circuits, register circuits or buffer circuits are interfaced at their input and output sections. In this case, however, these register circuits may be power supply type ones according to the prior art.

Figure 9:
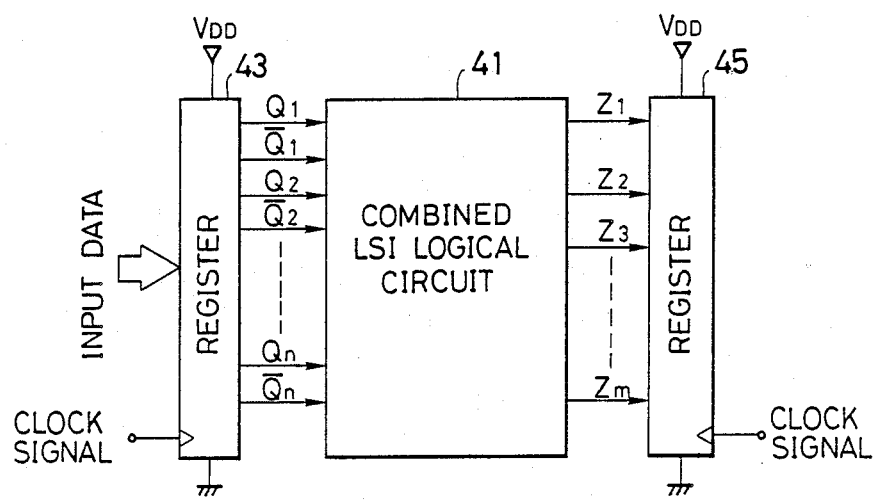
FIG. 9 shows a combined LSI logical circuit constructed by the logical circuits according to the present invention and associated input/output registers having MOS transistors with the power supplied type according to the prior art.

FIG. 9 shows a LSI logical circuit in combination with register circuits 43 and 45, which are constructed as input/output interface means by normal logical circuits with power supply. Namely, the registers 43 and 45 are power supply type ones according to the prior art, which are operated by a power supply $V_{pp}$ respectively.

In the figure, the register 43 is receptive of input data and produces output signals $Q_1$ to $Q_n$ and their inverted signals $\bar{Q}_1$ to $\bar{Q}_n$ to the LSI circuit 41. The register 45 is receptive of output signals $Z_1$ to $Z_n$ from the LSI circuit 41 and stores these signals therein. In the manner as described above, the so called "transfer type" logical circuits can be realized by the powerless logical circuits according to the present invention.

Figure 10:
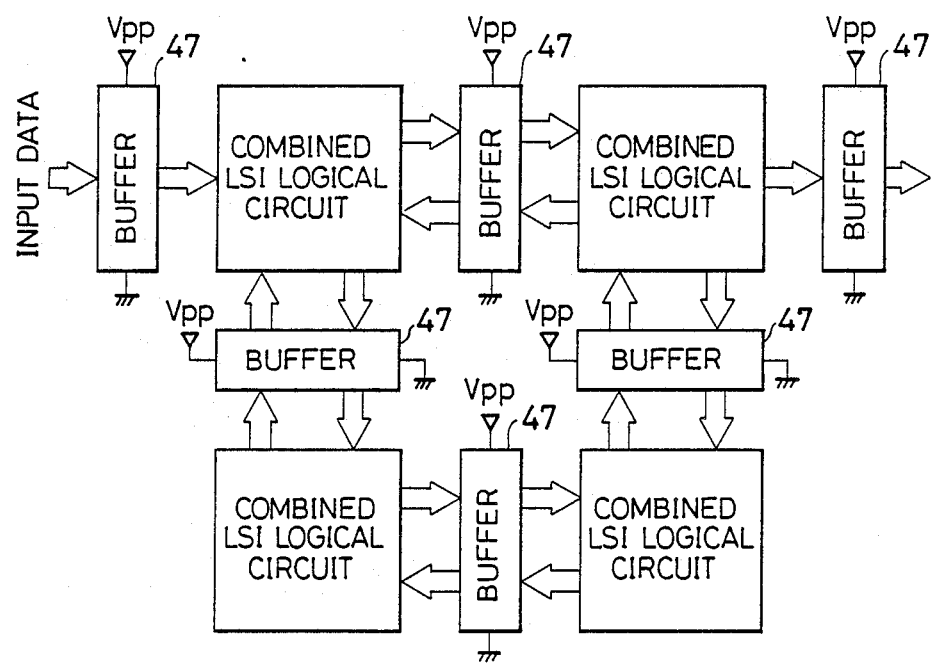
FIG. 10 shows a combined complex LSI logical circuit having a plurality of buffer circuits, according to still another embodiment of the present invention.
Figure 11:
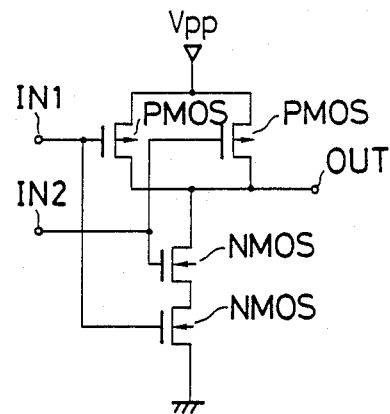
FIGS. 11 to 13 show each of the gate circuits with power supplies, according to the prior art, respectively.
Figure 12:
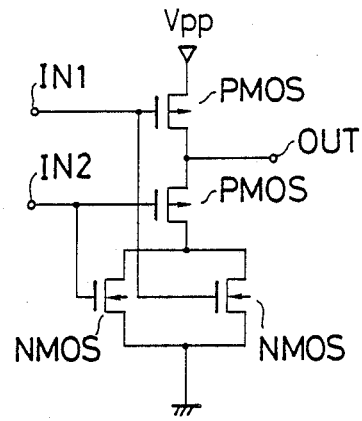
Figure 13:
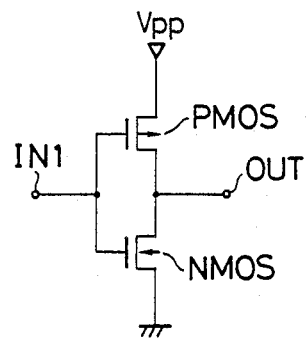

FIG. 10 shows a combined LSI logical circuit having a plurality of buffer circuits 47, 47, ... 47 as input/output interface means which are normal power supply type ones according to the prior art (the detailed construction of which are shown in FIGS. 11 to 13 with an explanation already given in the beginning of this specification), as well as the LSI logical circuits without power supplies. The buffer circuits in FIG. 10 may be replaced with the register circuits shown in FIG. 9.

As described in the foregoing embodiments according to the present invention, what is needed in the layout on the semiconductor substrates is only to pay attention to power supply for input/output interface means of the LSI circuits so that the layout of power lines can be facilitated. In the logical circuits combined by a plurality of gate circuits according to the present invention, power consumption as well as power supply wirings can be strikingly reduced. As a result, degradation of the quality of logical circuits due to electro-migration by excessive current can be prevented, thus improving the reliability of the logical circuits.

Since the power supply wirings for logical circuits can be dispensed with in the present invention, the possibility of malfunction due to power supply noise can also be prevented. In addition, each of the LSI logical circuits according to the present invention is constructed mainly by AND and OR logics, with the PMOS and NMOS transistors regularly connected. Thus, circuit designs can be easily carried out from the system logic designs, and thereby facilitates semiconductor circuit layout.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. A logical circuit for performing logical operations without a power supply, comprising:
   (a) a transfer gate section having a first type MOS transistor, the gate electrode of which is connected to a first input terminal to which a first input signal having one polarity is applied, and a second type MOS transistor, the gate electrode of which is connected to a second input terminal to which a second input signal having the opposite polarity is applied, the source electrodes of the first and second MOS transistors connected in parallel with each other being connected to a third input terminal to which a third input signal is applied, and the drain electrodes of the first and second MOS transistors connected in parallel being connected to an output terminal, and
   (b) a second type MOS switching transistor, the gate electrode of which is connected to the first input terminal, the remaining electrodes of the MOS switching transistor being connected to the output terminal and the second input terminal,
   whereby logical operation of the two input signals applied to the second and third input terminals is performed.

2. The logical circuit as claimed in claim 1, wherein said first type MOS transistor is a N-channel MOS transistor and said second type MOS transistor is a P-channel MOS transistor, and said second type MOS switching transistor is the P-channel MOS transistor.

3. The logical circuit as claimed in claim 2, wherein the logical circuit has an OR gate function when the input signals applied to the second and third input terminals are a first value a and a second value b, respectively.

4. The logical circuit as claimed in claim 1 wherein the logical circuit has a NAND gate function when the input signals applied to the third and second input terminals are an inversion $\bar{a}$ of a first value a and an inversion $\bar{b}$ of a second value b, respectively.

5. The logical circuit as claimed in claim 1, wherein the logical circuit has an OR gate function when the input signals applied to the second and third input terminals are a first value a and a second value b, respectively.

6. A logical circuit for performing logical operations without a power supply, comprising:
   (a) a transfer gate section having a first type MOS transistor, the gate electrode of which is connected to a first input terminal to which a first signal having one polarity is applied, and a second type MOS transistor, the gate electrode of which is connected to a second input terminal to which a second signal having the opposite polarity is applied, the source electrodes of the first and second MOS transistors connected in parallel with each other being connected to a third input terminal to which a third input signals is applied, and the drain electrodes of the first and second MOS transistors connected in parallel with each other being connected to an output terminal, and
   (b) a first type MOS switching transistor, the gate electrode of which is connected to the second input terminal, the remaining electrodes of the MOS switching transistor being connected to the output terminal and the first input terminal,
   whereby logical operation of the two input signals applied to the first and third input terminals is performed.

7. The logical circuit as claimed in claim 6 wherein said first type MOS transistor is an N-channel MOS transistor and said second type MOS transistor is a P-channel MOS transistor, and said first type MOS switching transistor is the N-channel MOS transistor.

8. The logical circuit as claimed in claim 6, wherein the logical circuit has an AND gate function when the input signals applied to the first and third input terminal are a first value a and a second value b.

9. The logical circuit as claimed in claim 6, wherein the logical circuit has a NOR gate function when the input signals applied to the first and third input terminals are an inversion $\bar{a}$ of a first value a and an inversion $\bar{b}$ of a second value b.

10. The logical circuit as claimed in claim 4, wherein the output terminal of the logical circuit is connected to the third input terminal of another logical circuit having the same construction, thereby constituting a three input terminal NAND gate circuit of $z = \overline{a \cdot b \cdot c}$.

11. The logical circuit as claimed in claim 4, wherein each of the logical circuits having a NAND gate function is respectively connected in a cascade successively so as to produce a resulting signal of multiple NAND logical operations.

12. The logical circuit as claimed in claim 8, wherein the output terminal of the logical circuit is connected to the third input terminal of another logical circuit having the same construction, thereby constituting a three input terminal AND gate circuit of $z = a \cdot b \cdot c$.

13. The logical circuit as claimed in claim 8, wherein each of the logical circuits having the AND gate function is respectively connected in a cascade successively so as to produce a resulting signal of multiple AND logical operations.

14. A collective logical circuit, comprising:
(a) at least one collective LSI logical circuit including a plurality of logical circuits without a power supply for performing various logical operations, each of the logical circuits having
  (i) a transfer gate section having a first type MOS transistor, the gate electrode of which is connected to a first input terminal to which a first input signal having one polarity is applied, and a second type MOS transistor, the gate electrode of which is connected to a second input terminal to which a second input signal having the opposite polarity is applied, the source electrodes of the first and second MOS transistors connected in parallel with each other being connected to a third input terminal to which a third input signal is applied, and the drain electrodes of the first and second MOS transistors connected in parallel being connected to an output terminal, and
  (ii) a second type MOS switching transistor, the gate electrode of which is connected to the first input terminal, the remaining electrodes of the MOS switching transistor being connected to the output terminal and the second input terminal;
(b) at least one input register consisting of gate circuits of a power supplied type for receiving multiple input data signals and for supplying output signals $Q_1$ to $Q_n$ and their inverted signals $\overline{Q_1}$ to $\overline{Q_n}$, respectively to said LSI logical circuit; and
(c) at least one output register consisting of gate circuits of the power supplied type for receiving each of the output signals $Z_1$ to $Z_n$ from the LSI logical circuit and for storing each of the output signals therein.

* * * * *